(12) United States Patent
Wang et al.

(10) Patent No.: US 12,736,841 B2
(45) Date of Patent: Sep. 15, 2026

(54) DISPLAY APPARATUS

(71) Applicant: BOE Technology Group Co., Ltd., Beijing (CN)

(72) Inventors: Zifeng Wang, Beijing (CN); Yan Ren, Beijing (CN); Lei Cao, Beijing (CN); Junmin Sun, Beijing (CN); Yunpeng Wu, Beijing (CN); Wenbin Wang, Beijing (CN); Zhaowei Li, Beijing (CN); Yushun Jie, Beijing (CN); Qiang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 323 days.

(21) Appl. No.: 18/703,796

(22) PCT Filed: Nov. 7, 2022

(86) PCT No.: PCT/CN2022/130216
§ 371 (c)(1),
(2) Date: Apr. 23, 2024

(87) PCT Pub. No.: WO2024/098173
PCT Pub. Date: May 16, 2024

(65) Prior Publication Data

US 2026/0161024 A1 Jun. 11, 2026

(51) Int. Cl.
*G02F 1/1333* (2006.01)
*G02F 1/1335* (2006.01)
(Continued)

(52) U.S. Cl.
CPC .. *G02F 1/133317* (2021.01); *G02F 1/133314* (2021.01); *G02F 1/133331* (2021.01);
(Continued)

(58) Field of Classification Search
CPC ......... G02F 1/133317; G02F 1/133331; G02F 1/133314; G02F 1/133628; G02F 1/13338;
(Continued)

(56) References Cited

U.S. PATENT DOCUMENTS

2007/0165152 A1 7/2007 Suzuki et al.
2015/0146117 A1* 5/2015 Lee ........................ G02B 30/25 349/15
2016/0363781 A1* 12/2016 Wu ..................... G02F 1/13394

FOREIGN PATENT DOCUMENTS

CN 102096218 A 6/2011
CN 103018946 A 4/2013
(Continued)

*Primary Examiner* — Anne M Hines
(74) *Attorney, Agent, or Firm* — Nath, Goldberg & Meyer; Joshua B. Goldberg

(57) ABSTRACT

The present disclosure provides a display apparatus, including a frame including a body, a plurality of side walls and limiting posts integrally formed, side walls are connected end to end to form an accommodation space with the body, and each limiting post is located on one side of the accommodation space and adjoins at least one of side walls; a backlight in accommodation space and fixed to the body, an orthographic projection of the backlight on the body is not overlapped with orthographic projections of limiting posts on the body; an optical assembly on a side of backlight away from the body, optical assembly is located in accommodation space and fixed to limiting posts; and a three-dimensional display assembly on a side of optical assembly away from the body, three-dimensional display assembly covers accommodation space and is fixed to side walls.

20 Claims, 13 Drawing Sheets

(51) Int. Cl.
*G02F 1/13357* (2006.01)
*H04N 13/302* (2018.01)
*H05K 7/20* (2006.01)

(52) U.S. Cl.
CPC .... *G02F 1/13338* (2013.01); *G02F 1/133512* (2013.01); *G02F 1/133526* (2013.01); *G02F 1/133608* (2013.01); *G02F 1/133628* (2021.01); *H04N 13/302* (2018.05); *H05K 7/20972* (2013.01); *H04N 2213/001* (2013.01)

(58) Field of Classification Search
CPC ......... G02F 1/133512; G02F 1/133526; G02F 1/133608; H04N 13/302; H04N 2213/001; H05K 7/20972
See application file for complete search history.

(56) References Cited

FOREIGN PATENT DOCUMENTS

| | | | |
|---|---|---|---|
| CN | 104777668 | A | 7/2015 |
| CN | 105182591 | A | 12/2015 |
| CN | 107145003 | A | 9/2017 |
| CN | 108153030 | A | 6/2018 |
| CN | 113504675 | A | 10/2021 |
| KR | 20090036642 | A | 4/2009 |

* cited by examiner 1043 105 108 1042 106 109 102 107 110

DISPLAY APPARATUS

This is a National Phase Application filed under 35 U.S.C. 371 as a national stage of PCT/CN2022/130216, filed Nov. 7, 2022, the content of which is hereby incorporated by reference in its entirety.

TECHNICAL FIELD

The present disclosure relates to the field of display technology, and particularly relates to a display apparatus.

BACKGROUND

With the continuous development of the display technology, the three-dimensional (3D) display technology has gained more and more attention. The three-dimensional display technology can enable a stereoscopic and vivid display image. The working principle is as follows: left and right eyes of a viewer respectively receive left and right eye images with certain parallax; after the two parallax images are respectively received by the left and right eyes of the viewer, the image informations are superposed and fused by the cerebral visual cortex, so as to construct a three-dimensional visual display effect.

SUMMARY

The display apparatus provided in the embodiments of the present disclosure adopts the following technical solutions:

In some embodiments, a display apparatus according to an embodiment of the present disclosure includes:

- a frame including a body, a plurality of side walls and a plurality of limiting posts integrally formed, wherein the side walls are connected end to end to form an accommodation space with the body, and each limiting post is located on one side of the accommodation space and adjoins at least one of the side walls;
- a backlight in the accommodation space and fixed to the body, wherein an orthographic projection of the backlight on the body is not overlapped with orthographic projections of the limiting posts on the body;
- an optical assembly on a side of the backlight away from the body, wherein the optical assembly is located in the accommodation space and fixed to the limiting posts; and
- a three-dimensional display assembly on a side of the optical assembly away from the body, wherein the three-dimensional display assembly covers the accommodation space and is fixed to the side walls.

In some embodiments, in the display apparatus provided in the embodiments of the present disclosure, the frame is made of a material including a heat conductive material.

In some embodiments, in the display apparatus provided in the embodiments of the present disclosure, the backlight is attached and secured to the body.

In some embodiments, in the display apparatus provided in the embodiments of the present disclosure, the three-dimensional display assembly includes a protective cover plate, and a liquid crystal display screen and a liquid crystal lens screen which are positioned on a side of the protective cover plate facing the optical assembly, wherein the liquid crystal display screen and the liquid crystal lens screen are located in the accommodation space, and the protective cover plate is fixed to the side walls.

In some embodiments, the display apparatus provided in the embodiments of the present disclosure further includes a first chip on film, a second chip on film, a third chip on film, a first control circuit board, a second control circuit board, and a third control circuit board; wherein the first control circuit board, the second control circuit board, and the third control circuit board are fixed to a side of the body away from the accommodation space; and one edge of the body is provided with a hollowed-out structure, the first chip on film passes through the hollowed-out structure and is electrically connected between the liquid crystal lens screen and the first control circuit board, the second chip on film passes through the hollowed-out structure and is electrically connected between the liquid crystal display screen and the second control circuit board, and the third chip on film passes through the hollowed-out structure and is electrically connected between the backlight and the third control circuit board.

In some embodiments, in the display apparatus provided in the embodiments of the present disclosure, the second control circuit board and the third control circuit board are arranged side by side on the body, and the third control circuit board is located on a side of the second control circuit board away from the hollowed-out structure; and the first control circuit board is fixed to a side of the second control circuit board away from the body.

In some embodiments, the display apparatus provided in the embodiments of the present disclosure further includes a shield case on a side of the first control circuit board, the second control circuit board and the third control circuit board away from the body, and the shield case is fixed to the body, wherein an orthographic projection of the shield case on the body covers an orthographic projection of the first control circuit board on the body, an orthographic projection of the second control circuit board on the body, and an orthographic projection of the third control circuit board on the body.

In some embodiments, the display apparatus provided in the embodiments of the present disclosure further includes a camera integrated board in the accommodation space, wherein an orthographic projection of the camera integrated board on the body is located within an orthographic projection of the hollowed-out structure on the body, and the camera integrated board is fixed to one of the side walls adjacent to the hollowed-out structure.

In some embodiments, the display apparatus provided in the embodiments of the present disclosure further includes a fourth control circuit board fixed to a side of the shield case away from the body, and the fourth control circuit board is electrically connected to the camera integrated board.

In some embodiments, in the display apparatus provided in the embodiments of the present disclosure, the body is provided to protrude in a direction away from the accommodation space at a position where the camera integrated board is provided.

In some embodiments, the display apparatus provided in the embodiments of the present disclosure further includes a light-shielding member on a side of the camera integrated board away from the protective cover plate, and the light-shielding member is located between one of the side walls fixed with the camera integrated board and the optical assembly, wherein the light-shielding member is fixed between the integrated circuit board and the shield case.

In some embodiments, the display apparatus provided in the embodiments of the present disclosure further includes a system circuit board fixed to the side of the body away from the accommodation space, wherein the system circuit board and the shield case are arranged on the body in a staggered manner.

In some embodiments, the display apparatus provided in the embodiments of the present disclosure further includes a heat dissipation plate fixed to a side of the system circuit board away from the body.

In some embodiments, the display apparatus provided in the embodiments of the present disclosure further includes a housing on a side of the heat dissipation plate and the shield case away from the body, wherein the housing is fixed to a side edge of the body away from the accommodation space.

In some embodiments, the display apparatus provided in the embodiments of the present disclosure further includes a button assembly in a space enclosed by the housing and the body, and the button assembly is fixed to the housing.

In some embodiments, in the display apparatus provided in the embodiments of the present disclosure, the housing includes button holes, the button assembly includes an icon button board and a button control board, the icon button board includes icon buttons arranged corresponding to the button holes, and the button control board is electrically connected to a side of the icon button board away from the housing.

In some embodiments, the display apparatus provided in the embodiments of the present disclosure further includes an adapter connecting the icon button board and the housing.

In some embodiments, in the display apparatus provided in the embodiments of the present disclosure, an annular limiting rib is provided on the side of the body away from the accommodation space, and the annular limiting rib is located in the space enclosed by the housing and the body, and the annular limiting rib abuts against the housing.

In some embodiments, in the display apparatus provided in the embodiments of the present disclosure, the adapter is fixed to the annular limiting rib.

In some embodiments, the display apparatus provided in the embodiments of the present disclosure further includes at least one turbofan fixed to a side of the heat dissipation plate facing the housing.

In some embodiments, the display apparatus provided in the embodiments of the present disclosure further includes at least one direct blowing fan fixed to a side of the body facing the housing, wherein the direct blowing fan, the system circuit board, and the shield case are arranged in a staggered manner.

In some embodiments, in the display apparatus provided in the embodiments of the present disclosure, the housing includes at least one wall hanging hole, wherein an orthographic projection of the at least one wall hanging hole on the body is located within an orthographic projection of the system circuit board on the body, and the orthographic projection of the at least one wall hanging hole is staggered from an orthographic projection of the turbofan on the body.

In some embodiments, in the display apparatus provided in the embodiments of the present disclosure, the system circuit board and the heat dissipation plate include a through hole directly opposite to the wall hanging hole.

In some embodiments, in the display apparatus provided in the embodiments of the present disclosure, the housing is recessed toward the accommodation space in a region surrounding the wall hanging hole.

In some embodiments, the display apparatus provided in the embodiments of the present disclosure further includes a wall hanging adapter fixed between the body and the housing adjacent to the wall hanging hole.

Figure 1A:
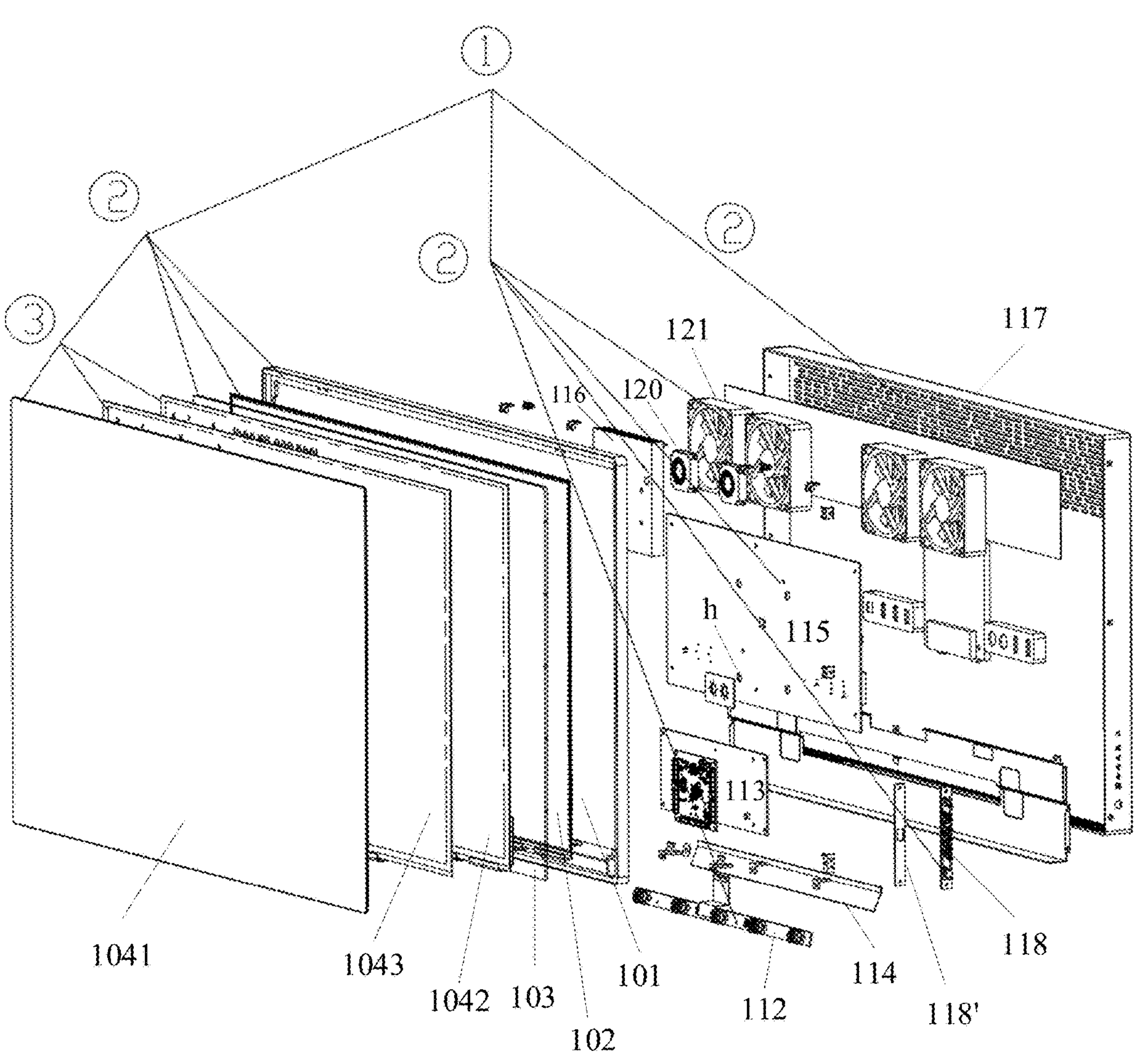
FIG. 1*a* is a schematic structural diagram of a display apparatus according to an embodiment of the present disclosure.

REFERENCE SIGNS frame—101; body—1011; side wall—1012; limiting post—1013; backlight—102; optical assembly—103; reflective sheet—1031; light guide plate—1032; optical film material—1033; three-dimensional display assembly—104; protective cover plate—1041; liquid crystal display screen—1042; liquid crystal lens screen—1043; first chip on film 105; second chip on film—106; third chip on film—107; first control circuit board—108; second control circuit board—109; third control circuit board—110; shield case—111; camera integrated board—112; fixing structure—112'; fourth control circuit board—113; camera identification and processing chip—1131; light-shielding member—114; system circuit board—115; master chip—1151; heat dissipation plate—116; housing—117; button assembly—118; icon button board—1181; button control board—1182; reinforcing plate—1183; adapter—119; turbofan—120; direct blowing fan—121; and wall hanging adapter—122.

DETAIL DESCRIPTION OF EMBODIMENTS

To make the objects, technical solutions and advantages of the embodiments of the present disclosure more apparent, the technical solutions according to the embodiments of the present disclosure will be clearly and completely described below with reference to the drawings of the embodiments of the present disclosure. It should be noted that the sizes and shapes of various components in the drawings are not to scale, but are merely intended to schematically illustrate the present disclosure. The same or similar reference signs refer to the same or similar elements or elements with the same or similar functions throughout the drawings. To keep the following description of the embodiments of the present disclosure clear and concise, detailed description of known functions and known components is omitted herein.

Unless otherwise defined, technical or scientific terms used herein are intended to have general meanings as understood by those of ordinary skill in the art. The words "first", "second" and similar terms used in the description and the claims of the present disclosure do not denote any order, quantity, or importance, but are used merely for distinguishing different components from each other. The word "comprising" or "including" or the like means that the element or item preceding the word contains elements or items that appear after the word or equivalents thereof, but does not exclude other elements or items. The terms "connected" or "coupled" and the like are not restricted to physical or mechanical connections, but may include electrical connections, whether direct or indirect. The words "inner", "outer", "upper", "lower", or the like are merely used to indicate a relative positional relationship, and when an absolute position of the described object is changed, the relative positional relationship may be changed accordingly.

In the following description, when an element or layer is referred to as being "on" or "connected to" another element or layer, it can be directly on, or connected to, the other element or layer, or intervening elements or layers may be present. When an element or layer is referred to as being "disposed on" "one side of" another element or layer, the element or layer may be directly on one side of, or directly connected to, the other element or layer, or intervening elements or layers may be present. However, when an element or layer is referred to as being "directly on" or "directly connected to" another element or layer, there is no intervening element or layer. The term "and/or" includes any and all combinations of one or more of the associated listed items.

The naked eye three-dimensional (3D) display technology is a display technology that can obtain a vivid and stereoscopic image in space and depth by means of the parallax property of the two eyes without any auxiliary equipment (e.g., 3D glasses). Since the stereoscopic image displayed on a naked eye 3D display apparatus has the advantages of real and vivid expression, better environmental infectivity, strong visual impact and the like, the naked eye 3D display apparatus are being applied to more and more application scenes. As one kind of naked eye 3D device, the light field display apparatus is coming close to the life, and for reliability of the whole product, the apparatus has to be reasonably arranged and designed to strengthen heat dissipation and robustness of the product.

To address at least one of the above technical problems in the existing art, an embodiment of the present disclosure provides a display apparatus which, as shown in FIGS. 1*a*, 1*b*, 2*a* and 2*b*, includes:

a frame 101 including a body 1011, a plurality of side walls 1012 and a plurality of limiting posts 1013 integrally formed, where the side walls 1012 are connected end to end to form an accommodation space r with the body 1011, and each limiting post 1013 is located on one side of the accommodation space r (in other words, each limiting post 1013 protrudes toward the accommodation space r with respect to the body 1011), and each limiting post 1013 adjoins at least one of the side walls 1012;

a backlight 102 in the accommodation space r, and the backlight 102 is fixed to the body 1011 to be supported by the body 1011, where an orthographic projection of the backlight 102 on the body 1011 is not overlapped with orthographic projections of the limiting posts 1013 on the body 1011;

an optical assembly 103 on a side of the backlight 102 away from the body 1011, where the optical assembly 103 is located in the accommodation space r, and the optical assembly 103 is fixed to the limiting posts 1013 to be supported by the limiting posts 1013; and a three-dimensional display assembly 104 on a side of the optical assembly 103 away from the body 1011, where the three-dimensional display assembly 104 covers the accommodation space r, and the three-dimensional display assembly 104 is fixed to the side walls 1012 to be stably supported by the side walls 1012.

In the existing art, the frame 101 is formed by a back plate, an intermediate frame, an outer frame and the like assembled together. In the display apparatus provided in the embodiments of the present disclosure, the frame 101 is provided as an integral structure, thereby saving the assembly and the like of the frame 101 itself. Moreover, by providing the integral frame 101, the backlight 102, the optical assembly 103 and the three-dimensional display assembly 104 can be fixed at the same time, thereby simplifying the overall layout of the display apparatus and improving the reliability of the display apparatus.

In some embodiments, in the display apparatus provided in the embodiments of the present disclosure, the frame 101 may be made of a material including a heat conductive material, such as aluminum, an aluminum alloy, or the like, so as to improve the heat dissipation performance of the frame 101, increase the heat transfer efficiency, and quickly conduct heat to the environment, while minimizing a weight of the frame 101 itself. In some embodiments, mass production of the frame 101 can be realized by computer numerical control (CNC) machining or cast aluminum, while a very good surface treatment shaping capability is ensured to obtain a fine appearance. Optionally, the backlight 102 may be attached and secured to the body 1011, to directly guide heat generated by the backlight 102 into the frame 101 for heat dissipation. In some embodiments, to prevent the backlight 102 from burning the optical assembly 103, instead of direct contact, a gap may be provided between the backlight 102 and the optical assembly 103 in the present disclosure. Optionally, the optical assembly 103 includes a reflective sheet 1031, a light guide plate 1032, an optical film material 1033 (including a diffusion film, a prism film, and a brightness enhancement film laminated on a side of the light guide plate 1032 away from the reflective sheet 1031), and the like, so as to realize sufficient and uniform brightness distribution of the backlight.

In some embodiments, the backlight 102 of the present disclosure may be a matrix light source, and beads in the matrix light source may be light-emitting diodes (LEDs), such as small size LEDs (micro LEDs, mini LEDs), or the like. Similar to organic light-emitting diodes (OLEDs), small size LEDs in the order of sub-millimeters or even microns belong to self-luminous devices, and has a series of advantages including high brightness, ultralow delay, over-large visual angle and the like. Further, since an inorganic light-emitting diode emits light based on a metal semiconductor with more stable properties and lower resistance, compared with the organic light-emitting diode which emits light based on organic matters, the inorganic light-emitting diode has the advantages of lower power consumption, higher resistance to high and low temperatures, and longer service life. In addition, when small size LEDs are used as the backlight 102, a more precise dynamic backlight effect can be achieved, which can solve the glare between bright and dark areas of a screen caused by the traditional dynamic backlight and improve the visual experience, while effectively increasing brightness and contrast of the screen.

In some embodiments, in the display apparatus provided in the embodiments of the present disclosure, as shown in FIGS. 1*a*, 1*b*, 2*a* and 2*b*, the three-dimensional display assembly 104 may include a protective cover plate 1041, and a liquid crystal display screen 1042 and a liquid crystal lens screen 1043 which are positioned on a side of the protective cover plate 1041 facing the optical assembly 103. The liquid crystal display screen 1042 and the liquid crystal lens screen 1043 are located in the accommodation space r, and the protective cover plate 1041 is fixed to the side walls 1012. Optionally, an edge of the protective cover plate 1041 may be attached to the side walls 1012 by a ring of glue G.

In some embodiments, the protective cover plate 1041 may be made of tempered glass, so that the protective cover plate 1041 has greater strength and light transmittance. The liquid crystal display screen may be a twisted nematic (TN) type liquid crystal display screen, or an advanced dimension switch (ADS) type liquid crystal display screen, a high-advanced dimension switch (HADS) type liquid crystal display screen, an in-plane switch (IPS) type liquid crystal display screen, or the like. In some embodiments, as shown in FIGS. 1*a*, 1*b*, 2*a* and 2*b*, the liquid crystal lens screen 1043 may be disposed between the liquid crystal display screen 1042 and the protective cover plate 1041. Apparently, in some embodiments, the liquid crystal display screen 1042 may be disposed between the liquid crystal lens screen 1043 and the protective cover plate 1041, which is not limited herein. Optionally, to enable more uniform light provision by the optical assembly 103, a gap may be provided between the optical assembly 103 and the three-dimensional display assembly 104. The gap can further ensure a sufficient expansion space for the optical assembly 103 at a high temperature, so as to prevent the optical assembly 103 from pressing the three-dimensional display assembly 104 due to the expansion at the high temperature, which may further affect the display effect.

In some embodiments, as shown in FIGS. 2*a*, 2*b*, 3, 4, 5*a*, 5*b*, 6*a*, 6*b*, 7*a* and 7*b*, the display apparatus provided in the embodiments of the present disclosure may further include a first chip on film 105, a second chip on film 106, a third chip on film 107, a first control circuit board 108, a second control circuit board 109, and a third control circuit board 110. The first control circuit board 108, the second control circuit board 109, and the third control circuit board 110 are fixed to a side of the body 1011 away from the accommodation space r. One edge (e.g., a lower edge) of the body 1011 is provided with a hollowed-out structure K. The first chip on film 105 passes through the hollowed-out structure K and is electrically connected between the liquid crystal lens screen 1043 and the first control circuit board 108. The second chip on film 106 passes through the hollowed-out structure K and is electrically connected between the liquid crystal display screen 1042 and the second control circuit board 109. The third chip on film 107 passes through the hollowed-out structure K and is electrically connected between the backlight 102 and the third control circuit board 110. Therefore, the first control circuit board 108 provides a driving signal for the liquid crystal lens screen 1043 through the first chip on film 105, the second control circuit board 109 provides a driving signal for the liquid crystal display screen 1042 through the second chip on film 106, and the third control circuit board 110 provides a driving signal for the backlight 102 through the third chip on film 107. Optionally, the first control circuit board 108, the second control circuit board 109, and the third control circuit board 110 may be flexible printed circuits (FPCs), printed circuit boards (PCBs), or the like. The number of first control circuit boards 108, the number of second control circuit boards 109, and the number of third control circuit boards 110 may be flexibly set according to actual needs, respectively. For example, one first control circuit board 108 is provided, while two second control circuit boards 109 and two third control circuit boards 110 are provided. In addition, as shown in FIGS. 5*a*, 5*b*, 6*a* and 6*b*, the hollowed-out structure K can further help to better release a material stress during processing of the frame 101, and reduce a deformation amount of the frame 101.

Figure 7A:
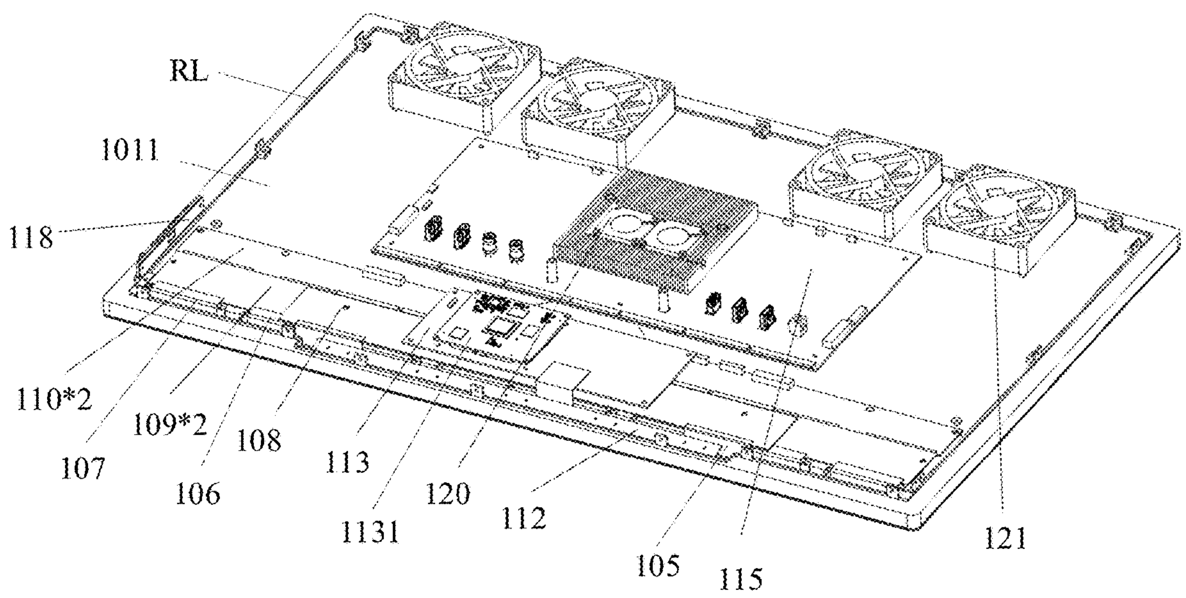
FIG. 7*a* is another schematic structural diagram of the display apparatus shown in FIG. 1*a;*
Figure 7B:
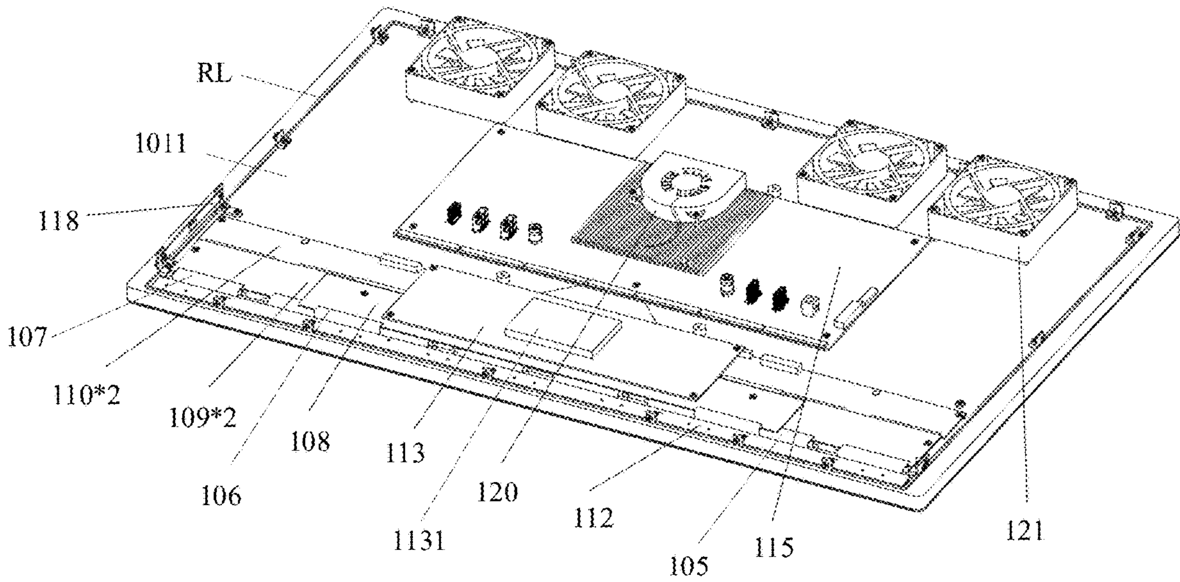
FIG. 7*b* is another schematic structural diagram of the display apparatus shown in FIG. 1*b;*

In some embodiments, in the display apparatus provided in the embodiments of the present disclosure, the first chip on film 105, the second chip on film 106, and the third chip on film 107 have different lengths, so that the first control circuit board 108, the second control circuit board 109, and the third control circuit board 110 can be arranged in a staggered manner on the side of the body 1011 away from the accommodation space r, thereby avoiding mutual interference. Optionally, as shown in FIGS. 7*a* and 7*b*, the second control circuit board 109 and the third control circuit board 110 may be arranged side by side on the body 1011, and the third control circuit board 110 is located on a side of the second control circuit board away from the hollowed-out structure K. In other words, the second control circuit board 109 is arranged closer to an edge of the accommodation space r than the third control circuit board 110, and the third control circuit board 110 is arranged closer to a central region of the accommodation space r than the second control circuit board 109. The first control circuit board 108 is fixed to a side of the second control circuit board 109 away from the body 1011. In some embodiments, the first control circuit board 108 may be fixed to the second control circuit board 109 through an adapter ring. It should be understood that the adapter ring is provided at a position that avoids various components on the first control circuit board 108 and the second control circuit board 109.

Figure 2A:
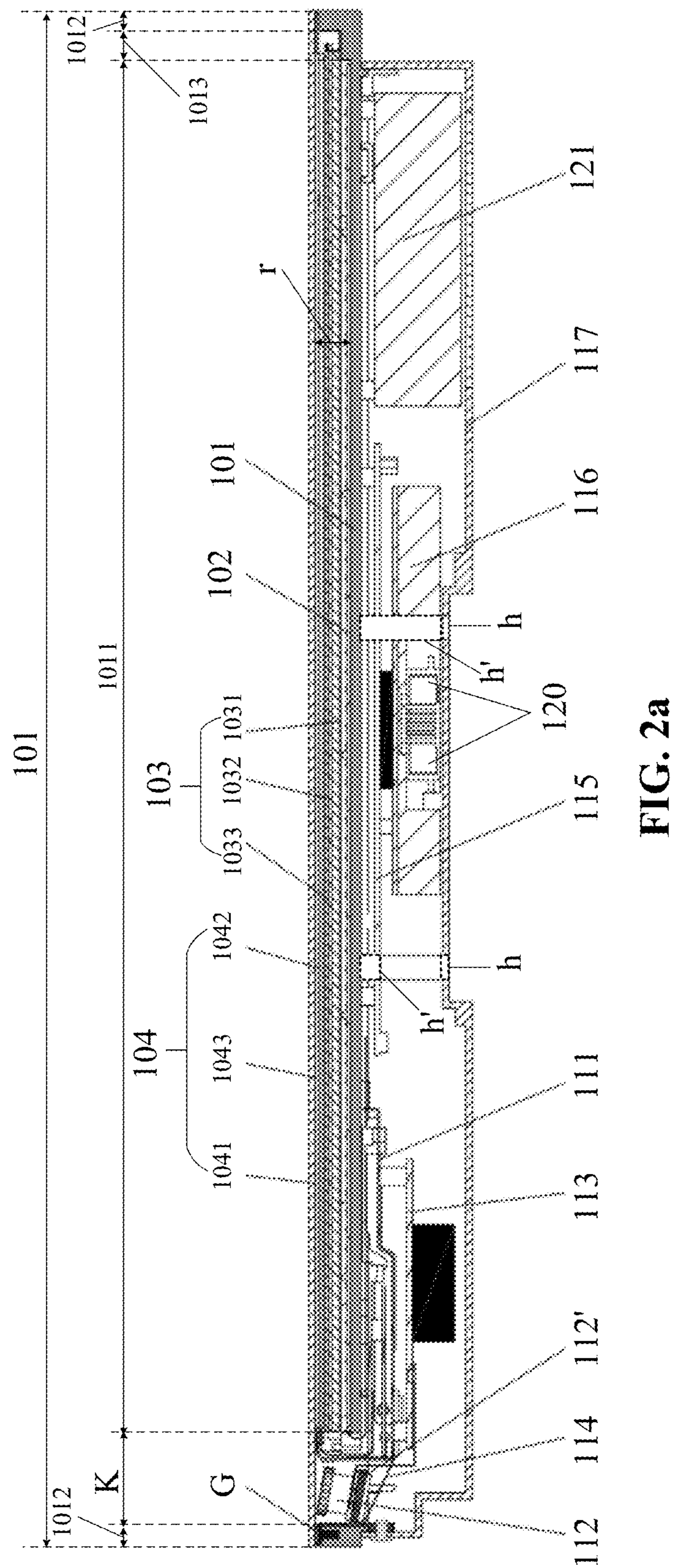
FIG. 2*a* is another schematic structural diagram of the display apparatus shown in FIG. 1*a;*
Figure 2B:
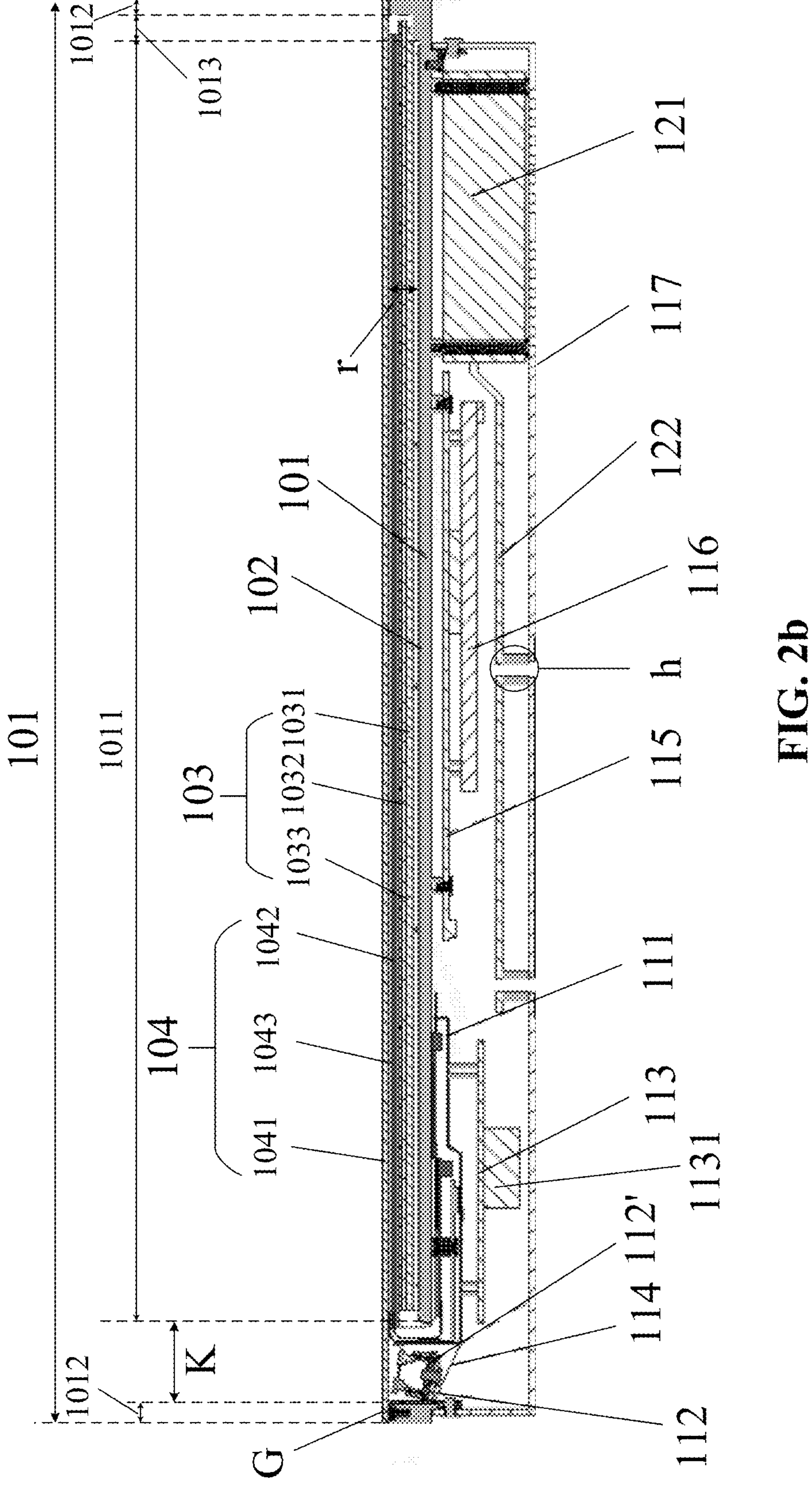
FIG. 2*b* is another schematic structural diagram of the display apparatus shown in FIG. 1*b;*
Figures 3, 4:
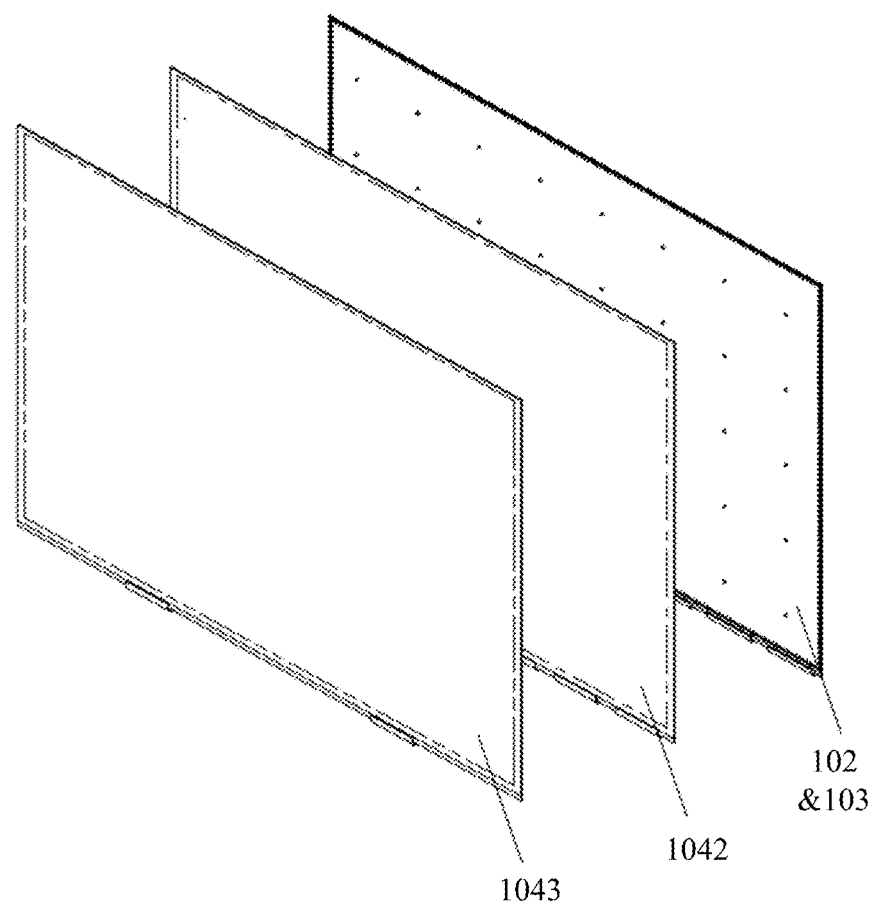
FIG. 3 is a schematic structural diagram of a three-dimensional display assembly according to an embodiment of the present disclosure.
FIG. 4 is another schematic structural diagram of the three-dimensional display assembly shown in FIG. 3.

In some embodiments, as shown in FIGS. 2*a* and 2*b*, the display apparatus provided in the embodiments of the present disclosure may further include a shield case 111. The shield case 111 is located on a side of the first control circuit board 108, the second control circuit board 109 and the third control circuit board 110 away from the body 1011, and the shield case 111 is fixed to the body 1011. An orthographic projection of the shield case 111 on the body 1011 covers an orthographic projection of the first control circuit board 108 on the body 1011, an orthographic projection of the second control circuit board 109 on the body 1011, and an orthographic projection of the third control circuit board 110 on the body 1011. In this manner, the display-related first control circuit board 108, second control circuit board 109 and third control circuit board 110 can be electromagnetically shielded and protected by the shield case 111.

In some embodiments, as shown in FIGS. 1*a*, 1*b*, 2*a*, 2*b*, 7*a* and 7*b*, the display apparatus provided in the embodiments of the present disclosure may further include a camera integrated board 112 in the accommodation space r. An orthographic projection of the camera integrated board 112 on the body 1011 is located within an orthographic projection of the hollowed-out structure K on the body 1011. The camera integrated board 112 is fixed to one of the side walls 1012 adjacent to the hollowed-out structure K. Optionally, the camera integrated board 112 is fixed to the side wall 1012 through a fixing structure 112'. The camera integrated board 112 may be understood as a camera assembly which can adjust the image according to the position of human eyes in real time to perform intelligent display during naked eye 3D display.

In some embodiments, as shown in FIGS. 1*a*, 1*b*, 2*a*, 2*b*, 7*a* and 7*b*, the display apparatus provided in the embodiments of the present disclosure may further include a fourth control circuit board 113. The fourth control circuit board 113 is fixed to a side of the shield case 111 away from the body 1011, and the fourth control circuit board 113 is electrically connected to the camera integrated board 112, so as to provide an electrical signal for the camera integrated board 112 through the fourth control circuit board 113. Optionally, the fourth control circuit board 113 may be fixed to the shield case 111 by a stud or the like. The fourth control circuit board 113 may have a camera identification and processing chip 1131.

Figure 5A:
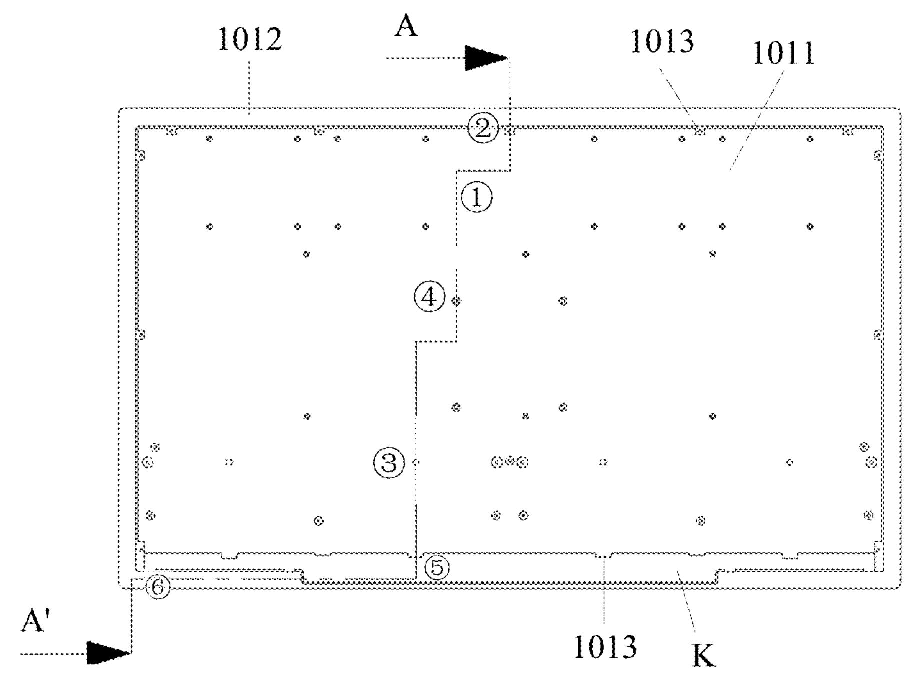
FIG. 5*a* is a schematic structural diagram of a frame in the display apparatus shown in FIG. 1*a;*
Figure 5B:
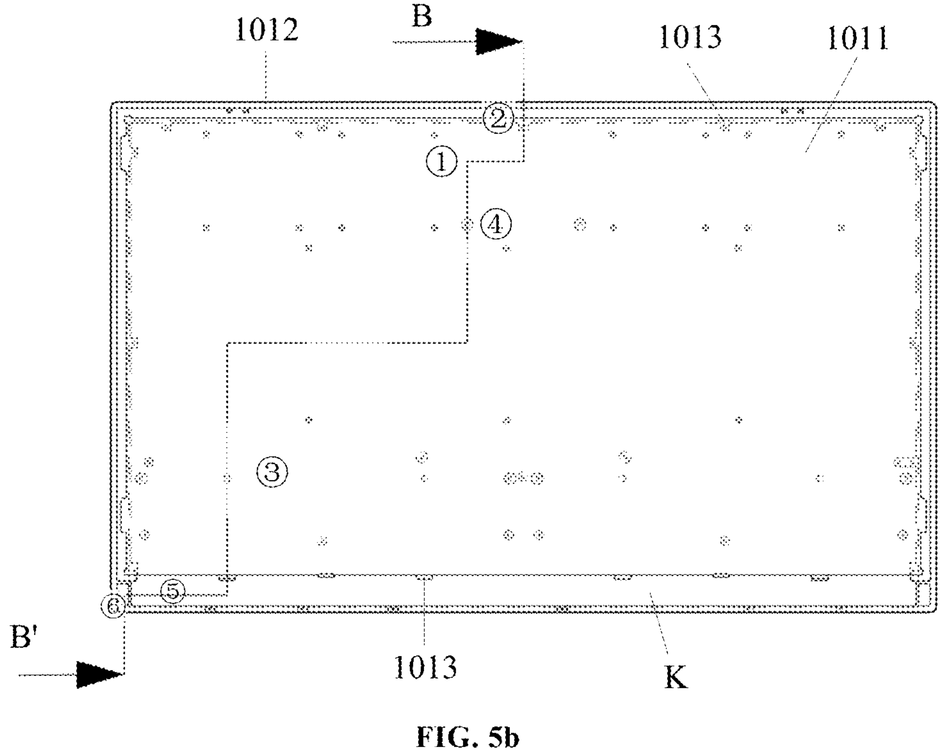
FIG. 5*b* is a schematic structural diagram of a frame in the display apparatus shown in FIG. 1*b;*
Figure 6A:
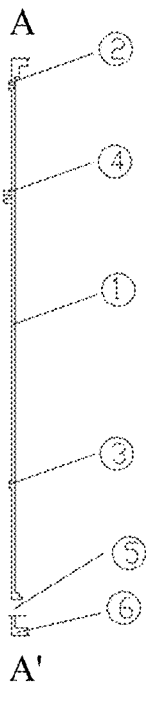
FIG. 6*a* is a sectional view taken along line A-A' of FIG. 5*a;*
Figure 6B:
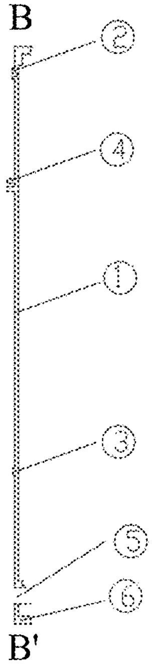
FIG. 6*b* is a sectional view taken along line B-B' of FIG. 5*b;*

In some embodiments, in the display apparatus provided in the embodiments of the present disclosure, as shown in FIGS. 5*a* and 7*a*, the body 1011 may be provided to protrude in a direction away from the accommodation space r at a position where the camera integrated board 112 is provided, so that the camera integrated board 112 is disposed at the protruding position of the body 1011, and a more compact structure of the product is obtained. Apparently, in some embodiments, an edge of the body 1011 on the side where the camera integrated board 112 is located may be provided flush as a whole (as shown in FIGS. 5*b* and 7*b*), which is not limited herein. It should be understood that, in the case that the edge of the body 1011 on the side where the camera integrated board 112 is located is provided flush as a whole, the camera integrated board 112 may have a length smaller than, or substantially the same as (as shown in FIGS. 5*b* and 7*b*), the edge of the body 1011 on the side where the camera integrated board is located. As used herein, the phrase "substantially the same" may be understood as identical or within a reasonable error margin (e.g., ±5%) due to fabrication, measurement, or the like.

In some embodiments, as shown in FIGS. 2*a* and 2*b*, the display apparatus provided in the embodiments of the present disclosure may further include a light-shielding member 114. The light-shielding member 114 is located on a side of the camera integrated board 112 away from the protective cover plate 1041, and between one of the side walls 1012 fixed with the camera integrated board 112 and the optical assembly 103, so that the light-shielding member 114 can prevent lower side ambient light and lateral light from the optical assembly 103 from impinging on the camera integrated board 112, so as to prevent affecting imaging by the camera integrated board 112 tracking the position of human eyes. Optionally, the light-shielding member 114 is fixed between the integrated circuit board 112 and the shield case 111.

In some embodiments, as shown in FIGS. 2*a*, 2*b*, 7*a* and 7*b*, the display apparatus provided in the embodiments of the present disclosure may further include a system circuit board 115 fixed to the side of the body 1011 away from the accommodation space r. The system circuit board 115 and the shield case 111 are arranged on the body 1011 in a staggered manner. In some embodiments, the system circuit board 115 is electrically connected to the first control circuit board 108, the second control circuit board 109, the third control circuit board 110, and the fourth control circuit board 113, respectively, so as to provide corresponding current signals, logic signals and the like for the first control circuit board 108, the second control circuit board 109, the third control circuit board 110, and the fourth control circuit board 113 through the system circuit board 115.

In some embodiments, as shown in FIGS. 1*a*, 1*b*, 2*a* and 2*b*, the display apparatus provided in the embodiments of the present disclosure may further include a heat dissipation plate 116. The heat dissipation plate 116 is fixed to a side of the system circuit board 115 away from the body 101, so as to increase the heat dissipation efficiency of the master chip 1551 on the system circuit board 115. Optionally, the heat dissipation plate 116 may be made of a material with good thermal conductivity, such as aluminum or an aluminum alloy, or the like, so that the heat dissipation plate 116 has a light weight, which is beneficial to reducing the overall weight of the display apparatus.

In some embodiments, as shown in FIGS. 1*a*, 1*b*, 2*a* and 2*b*, the display apparatus provided in the embodiments of the present disclosure may further include a housing 117. The housing is located on a side of the heat dissipation plate 116 and the shield case 111 away from the body 1011. The housing 117 is fixed to a side edge of the body 1011 away from the accommodation space r, so as to protect the first control circuit board 108, the second control circuit board 109, the third control circuit board 110, the fourth control circuit board 113, the system circuit board 115, and the like on the side of the body 1011 away from the accommodation space r by the housing 117. Optionally, the housing 117 may be made of a heat conductive material such as an aluminum alloy, so that the heat source conduction efficiency is increased across the display apparatus, and a lighter housing 117 is obtained. It should be understood that since the housing 117 is fixed to a side edge of the body 1011 away from the accommodation space r, a bottom of the housing 117 (directly opposite to the body 1011) may have a shape similar to the body 1011. On this basis, while the body 1011 is provided to protrude at the position of the camera integrated board 112, the housing 117 may protrude correspondingly to match the shape of the body 1011, so as to enhance the stable connection between the housing 117 and the body 1011.

In some embodiments, as shown in FIGS. 7*a*, 7*b*, 8*a*, 8*b* and 9, the display apparatus provided in the embodiments of the present disclosure may further include a button assembly 118. The button assembly 118 is located in a space enclosed by the housing 117 and the body 1011. The button assembly 118 is fixed to the housing 117. Optionally, the housing 117 includes button holes H. The button assembly 118 includes an icon button board 1181 and a button control board 1182. The icon button board 1181 includes buttons directly made of icons, that is, icon buttons (e.g., an on/off button, a volume button, or the like). The icon buttons are arranged corresponding to the button holes H. The button control board 1182 is electrically connected to a side of the icon button board 1181 away from the housing 117. In this manner, the icon buttons can be matched with the corresponding button holes H in the same high precision to satisfy a better assembly mode, thereby ensuring the control hand feeling of the icon buttons. Optionally, as shown in FIG. 1*a*, a reinforcing plate 1183 may be further disposed on the button assembly 118 to enhance the strength of the button assembly 118.

Figure 9:
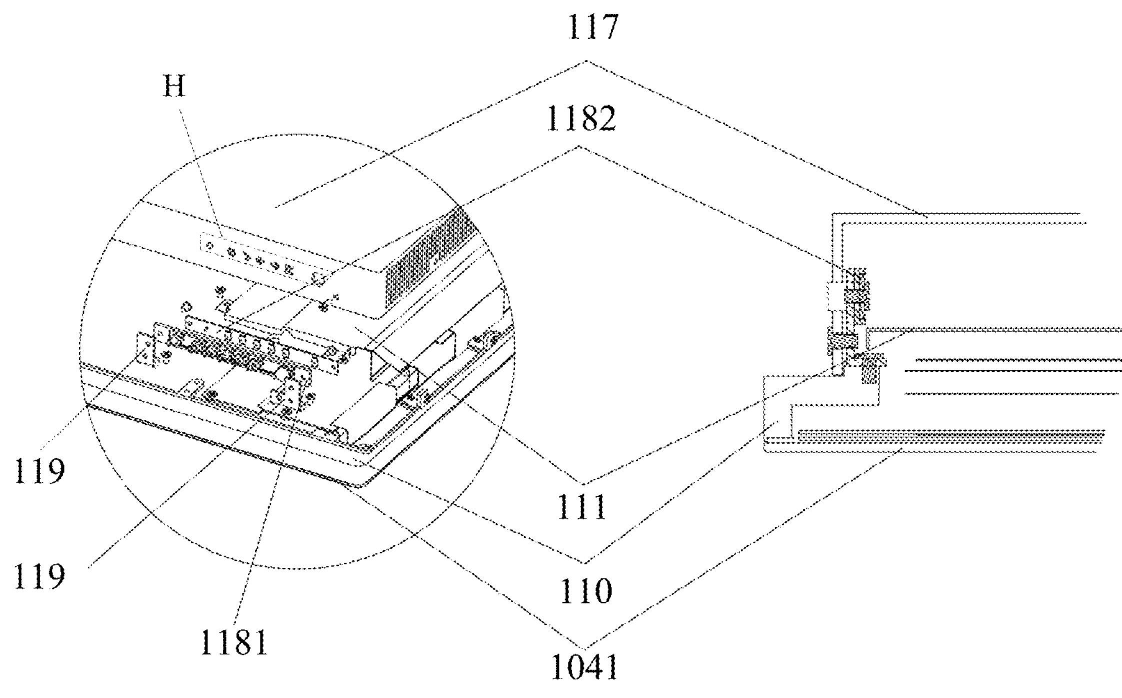
FIG. 9 is an enlarged structural diagram of region Z in FIGS. 8*a* and 8*b;*
Figure 10A:
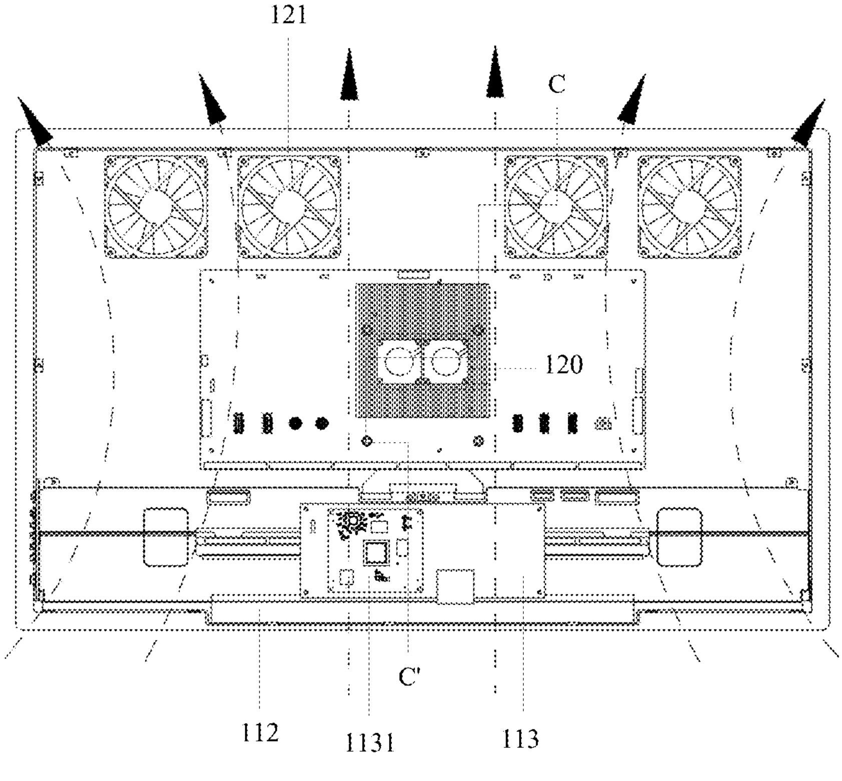
FIG. 10*a* is another schematic structural diagram of the display apparatus shown in FIG. 1*a;*
Figure 10B:
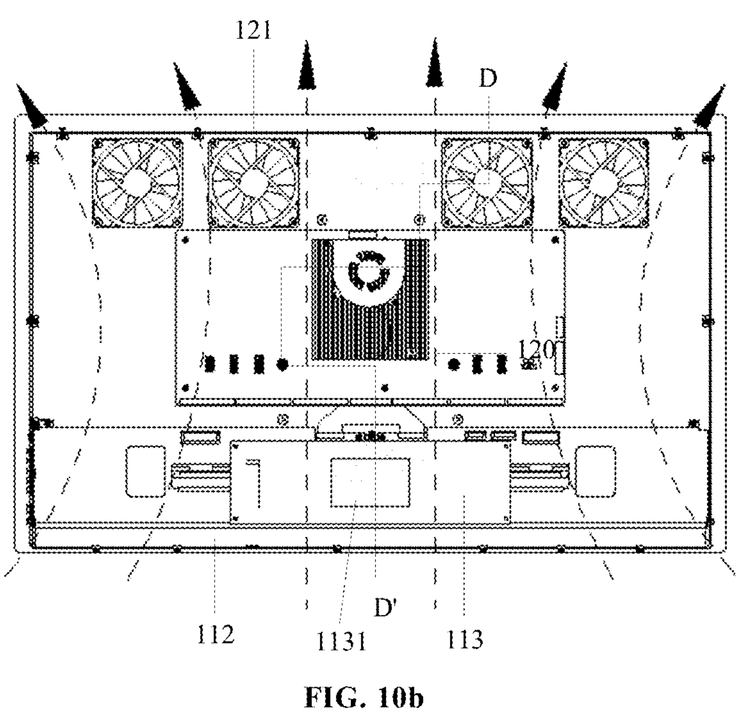
FIG. 10*b* is another schematic structural diagram of the display apparatus shown in FIG. 1*b;*
Figure 11A:
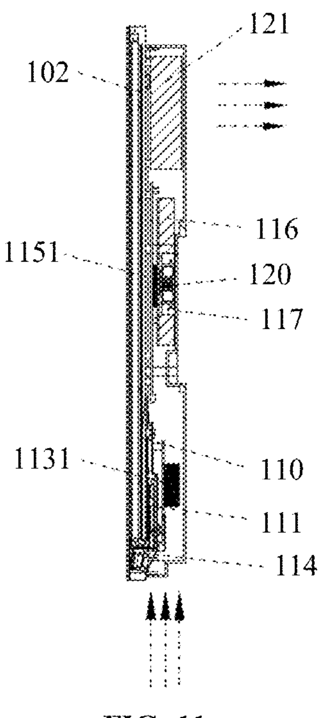
FIG. 11*a* is a sectional view taken along line C-C' of FIG. 10*a;*
Figure 11B:
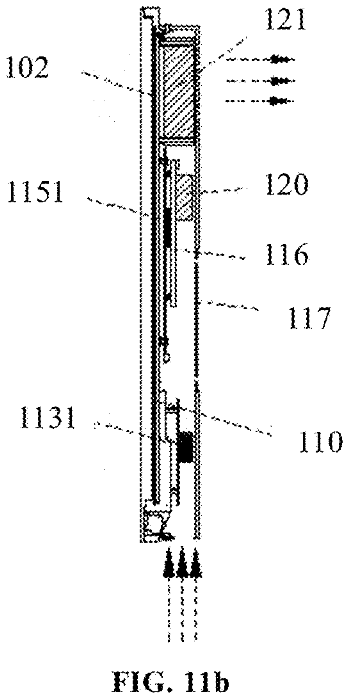
FIG. 11*b* is a sectional view taken along line D-D' of FIG. 10*b;*
Figure 12A:
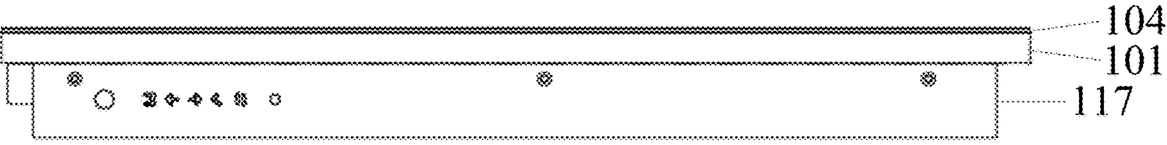
FIG. 12*a* is a single perspective view of the display apparatus shown in FIG. 1*a;*
Figure 12B:
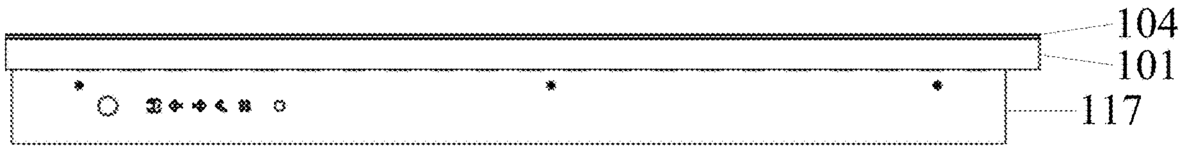
FIG. 12*b* is a single perspective view of the display apparatus shown in FIG. 1*b;*
Figures 13A, 13B:
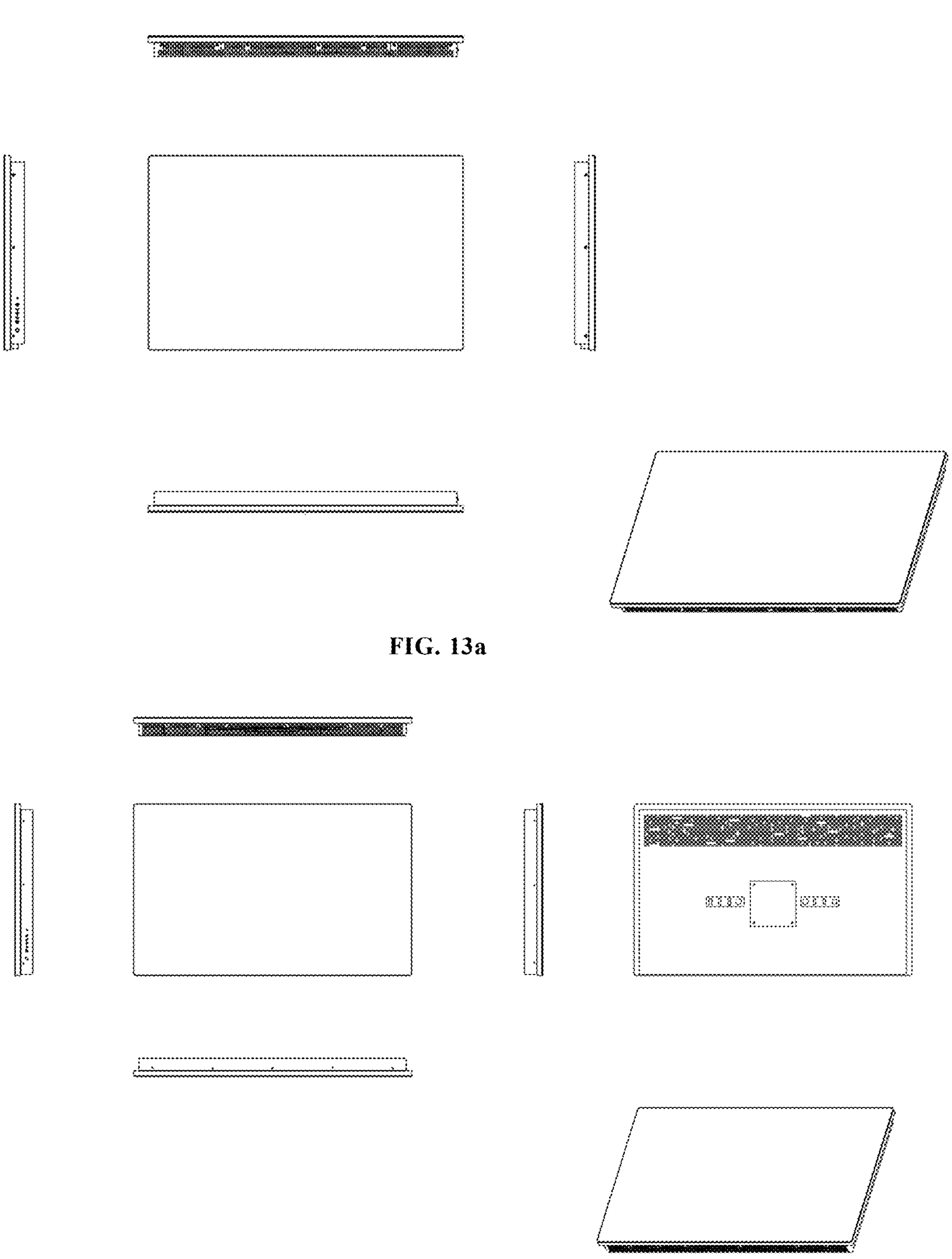
FIG. 13*a* is a multi-perspective view of the display apparatus shown in FIG. 1*a*.
FIG. 13*b* is a multi-perspective view of the display apparatus shown in FIG. 1*b*.

In some embodiments, as shown in FIG. 9, the display apparatus provided in the embodiments of the present disclosure may further include an adapter 119. The adapter 119 connects the icon button board 1181 and the housing 117. Optionally, the adapter 119 may be made of a high strength material (e.g., stainless steel). In some embodiments, as shown in FIGS. 7*a* and 7*b*, an annular limiting rib RL is provided on the side of the body 1011 away from the accommodation space r. The annular limiting rib RL is located in the space enclosed by the housing 117 and the body 1011 and abuts against the housing 117. The annular limiting rib RL can prevent overall warping of the body 1011, while serving as a precision limiting feature for the housing 117. In some embodiments, as shown in FIG. 9, one end of the adapter 119 may be locked and attached to a limiting bump on the annular limiting rib RL in a limiting manner, while the other end may be fixed to the icon button board 1181, and the housing 117 is also fixed to the adapter 119 when the housing 117 is assembled, which is equivalent to fixing the housing 117 and the integral button assembly 118 taking the adapter 119 as a unified reference, thereby reducing excessive accumulated tolerance and ensuring precise matching.

In some embodiments, as shown in FIGS. 1*a*, 1*b*, 2*a*, 2*b*, 7*a*, 7*b*, 10*a*, 10*b*, 11*a* and 11*b*, the display apparatus provided in the embodiments of the present disclosure may further include at least one turbofan 120. The turbo 120 is connected to a side of the heat dissipation plate 116 facing the housing 117, so that heat generated by the master chip 1151 of the system circuit board 115 can be conducted through the heat dissipation plate 116 and absorbed by the turbofan 120 for cooling, thereby avoiding damage to the master chip 1151 due to overheating.

In some embodiments, as shown in FIGS. 1*a*, 1*b*, 2*a*, 2*b*, 7*a*, 7*b*, 10*a*, 10*b*, 11*a* and 11*b*, the display apparatus provided in the embodiments of the present disclosure may further include at least one direct blowing fan 121 fixed to a side of the body 1011 facing the housing 117. The direct blowing fan 121, the system circuit board 115, and the shield case 111 are arranged in a staggered manner. As can be seen from FIGS. 10*a*, 10*b*, 11*a* and 11*b*, the arrow direction shows a lower air inlet, while an air outlet is provided backward from an upper side. In the heat dissipation process from bottom to top, in combination with the turbofan 120 absorbing heat, the upstream heat dissipation plate 116 conducts heat to supply air quickly upwards, and at the same time, at least one (for example, four) speed-adjustable direct blowing fan 121 is used to perform overall dynamic temperature control, so that global heat dissipation is finally realized, and air ducts of the display apparatus is smooth in both horizontal and vertical directions.

Figure 8A:
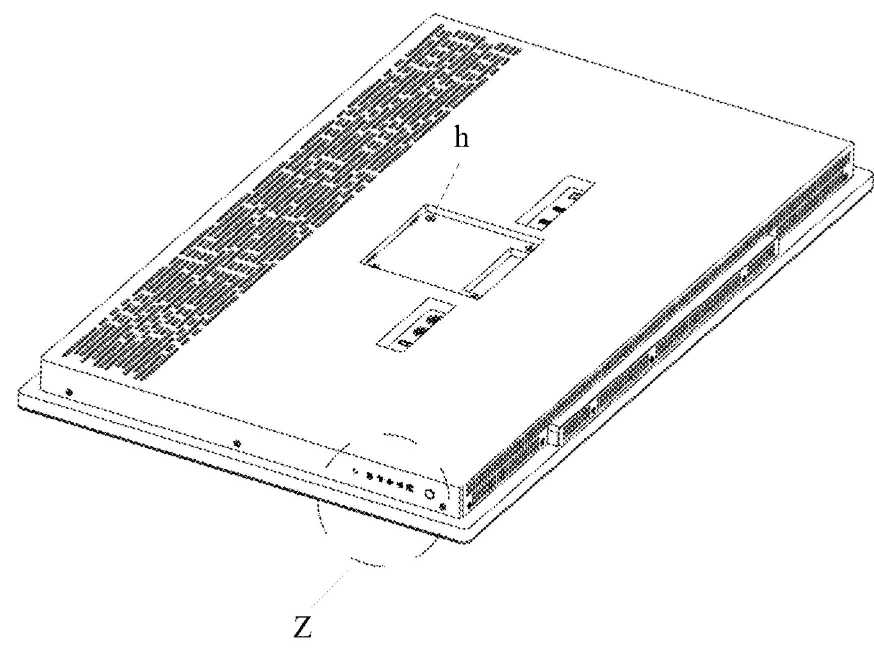
FIG. 8*a* is another schematic structural diagram of the display apparatus shown in FIG. 1*a;*
Figure 8B:
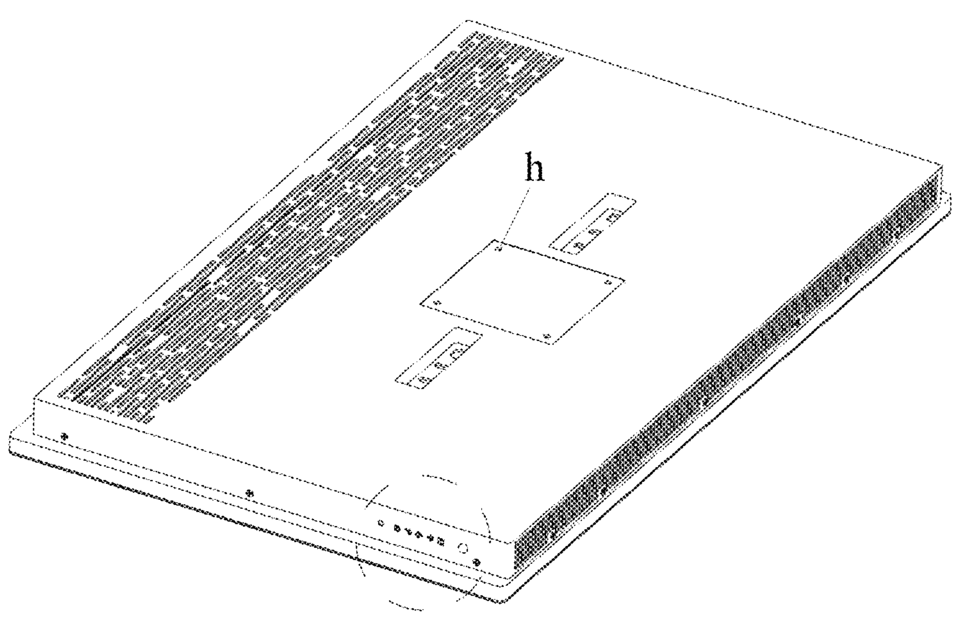
FIG. 8*b* is another schematic structural diagram of the display apparatus shown in FIG. 1*b;*

In some embodiments, in the display apparatus provided in the embodiments of the present disclosure, as shown in FIGS. 1*a*, 1*b*, 2*a* and 2*b*, the housing 117 includes at least one wall hanging hole h. An orthographic projection of the at least one wall hanging hole h on the body 1011 is located within an orthographic projection of the system circuit board 115 on the body 1011. The orthographic projection of the at least one wall hanging hole h on the body 1011 is staggered from an orthographic projection of the turbofan 119 on the body 1011. The wall hanging hole h can enable installation and type selections of different brackets, and customization of brackets for different application scenes, such as an operating room, a game center, and the like, resulting in higher universality. Optionally, as shown in FIGS. 8*a* and 8*b*, in the case of more than one (e.g., four) wall hanging holes h, the (four) wall hanging holes h may be uniformly distributed at a central position of the housing 117 to reduce stress concentration on the support.

In some embodiments, in the display apparatus provided in the embodiments of the present disclosure, as shown in FIG. 2*a*, the system circuit board 115 and the heat dissipation plate 116 may include a through hole h' directly opposite to the wall hanging hole h, so that the bracket may be installed on the body 1011 by means of the wall hanging hole h and the through hole h' running through therein. Alternatively, as shown in FIG. 2*b*, the display apparatus may further include a wall hanging adapter 122. The wall hanging adapter 122 may be connected between the body 1011 and the housing 117 adjacent to the wall hanging hole h, so that the bracket may be fixed on the body 1011 through the wall hanging hole h and the wall hanging adapter 122. Optionally, as shown in FIG. 8*a*, the housing 117 is recessed toward the accommodation spacer in a region surrounding the wall hanging hole h (e.g., a central position on a bottom of the housing 117 opposite to the body 1011), so as to accommodate a bracket such as a base in the recessed position. Apparently, in some embodiments, as shown in FIG. 8*b*, the bottom of the housing 117 (opposite to the body 1011) may be flat.

It should be noted that, as shown in FIGS. 5*a*, 5*b*, 6*a* and 6*b*, the strength of the frame 101 can be enhanced in six ways in the present disclosure, including: ① providing the body 1011 having a thickness between 2.5 mm and 3.5 mm, to ensure flatness and strength of the frame 101; ② providing annular limiting ribs RL at four edges on a back side of the frame 101 (equivalent to a side of the body 1011 away from the accommodation space r), to prevent overall warping of the body 1011 while serving as a precision limiting feature for the housing 117; ③ providing a bump having the same height as the annular limiting ribs RL on the back side of the frame 101 (equivalent to the side of the body 1011 away from the accommodation space r), and connecting relevant plates of the system on the bump through holes (for example, studs for various circuit boards may be connected and fixed on the bump); ④ riveting the bracket with adapter studs (arranged corresponding to the wall hanging hole h in the housing 117), where four adapter studs are uniformly distributed at a central position of the body 1101 to reduce stress concentration on the support; ⑤ opening a hollowed-out structure K on a lower edge of the body 1101 (where the hollowed-out structure K may be the slot in FIG. 5*a* that is located at a lower central position extending from left to right, or the hollowed-out structure K may be the slot in FIG. 5*b* that is located on the lower side across left and right), so that a material stress can be better released through the hollowed-out structure K during CNC processing, and the deformation amount can be reduced; and ⑥ increasing a thickness of the side wall 1012 to 5.5 to 6.5 mm compared with that of the body 1011, to further ensure flatness and strength of the integral frame 101.

In some embodiments, different perspectives of diagrams of the display apparatus are further provided in the present disclosure, and as shown in FIGS. 12*a*, 12*b*, 13*a* and 13*b*, to achieve visual thinning of the overall appearance while reducing the overall weight, modules for light field display (including the three-dimensional display assembly 104, the optical assembly 103, the backlight 102, and the frame 101) are visually separated from the set surrounded by the housing 117, but structurally integrated. In some embodiments, the three-dimensional display assembly 104, and the backlight module layer including the optical assembly 103, the backlight 102 and the frame 101, are visually distinct from the set in terms of material and structure.

Figure 1B:
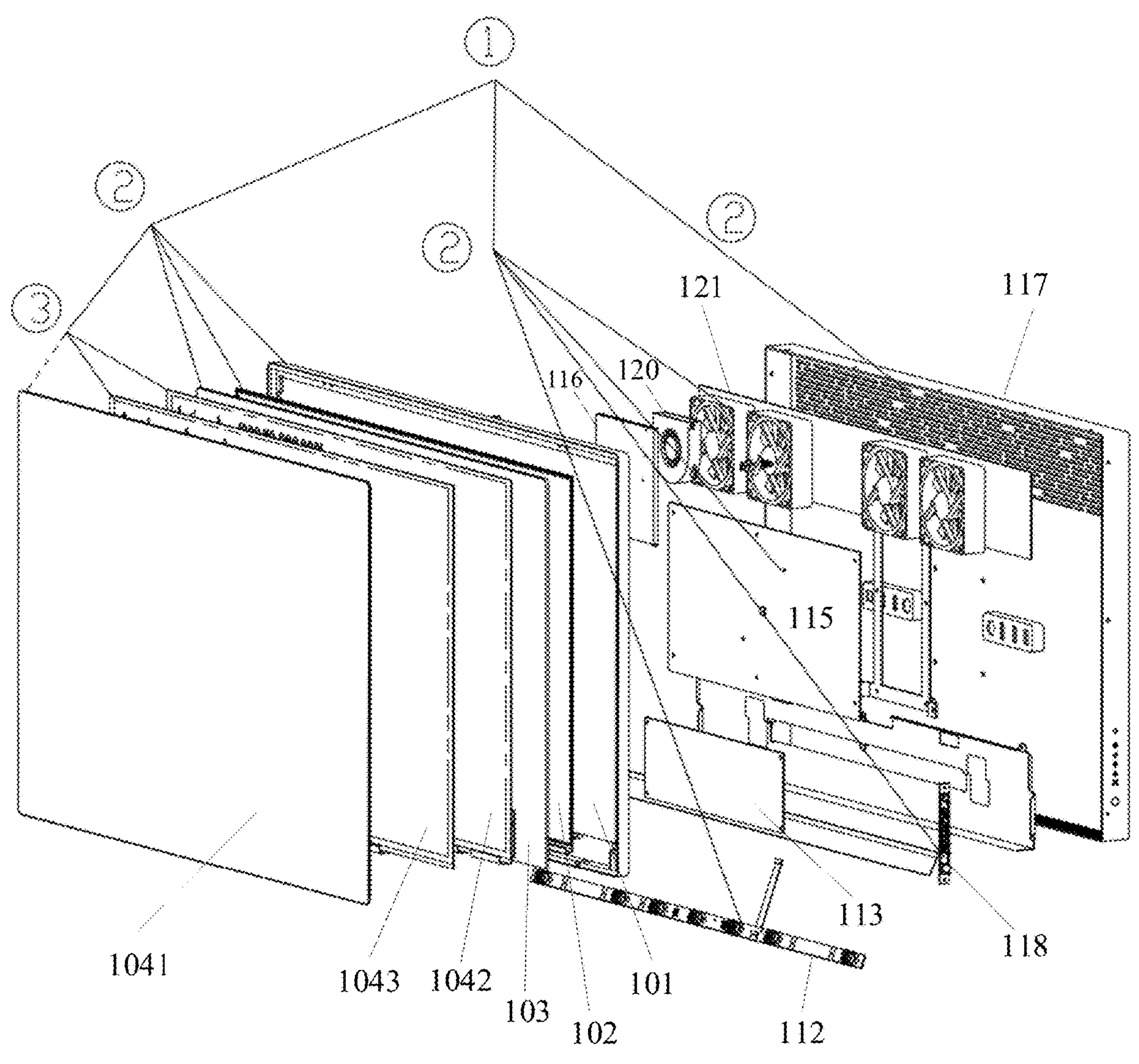
FIG. 1*b* is another schematic structural diagram of a display apparatus according to an embodiment of the present disclosure.

In addition, as shown in FIGS. 1*a* and 1*b*, to realize integration of the display apparatus, large assemblies in the present disclosure may be classified and modularized during assembly of the display apparatus, where an three-dimensional display assembly 104 indicated by ③ is provided. The three-dimensional display assembly 104 includes a protective cover plate 1041, a liquid crystal display screen 1042, and a liquid crystal lens screen 1043 which form an integral assembly. The three-dimensional display assembly 104 forms the complete display assembly with an optical assembly 103, a backlight 102, a frame 101, a first chip on film 105, a second chip on film 106, a third chip on film 107, a first control circuit board 108, a second control circuit board 109, and a third control circuit board 110. Then, all the system assemblies indicated by ②, including an intelligent camera assembly (including an camera integrated board 112, a fourth control circuit board 113, and a light-shielding member 114), a button assembly 118 (including an icon button board 1181 and a button control board 1182), a system board assembly (including a system circuit board 115 and a heat dissipation plate 116), a fan assembly (including a turbofan 120 and a direct blowing fan 121), and the like, are completely and systematically assembled. Finally, the housing 117 and the frame 101 are locked and attached together to implement integral assembly of the apparatus and obtain the display apparatus indicated by ①.

In conclusion, in terms of the light field display 3D and high-definition display effect, the present disclosure realizes a product design of high super-integration and high reliability through structural design and layout. Through industrial design and structural layout, integral design of the apparatus is implemented to achieve a visual sense of depth, and to reduce the weight and material quantity of the apparatus. Through the design of the integral frame, modules and systems are integrated to enable reasonable layout of the structural layers, thereby ensuring high reliability in strength and heat conduction of the apparatus. Through the integral button design, personalized controls can be matched with other assemblies with relatively high precision, thereby ensuring the control hand feeling. A global heat dissipation scheme is adopted for the heat source in the apparatus to reasonably control a surface temperature of the apparatus. By classifying and assembling the assemblies and the modules, the production efficiency of the apparatus is increased.

Although the present disclosure has described preferred embodiments, it should be understood that those skilled in the art may make various changes and variations to the embodiments of the present disclosure without departing from the spirit and scope of the embodiments of the present disclosure. Therefore, if such modifications and variations to the embodiments of the present disclosure are within the scope of the claims of the present disclosure and their equivalents, the present disclosure is also intended to encompass such modifications and variations.

What is claimed is:

1. A display apparatus, comprising:

a frame comprising a body, a plurality of side walls and a plurality of limiting posts integrally formed, wherein the side walls are connected end to end to form an accommodation space with the body, and each limiting post is located on one side of the accommodation space and adjoins at least one of the side walls;

a backlight in the accommodation space and fixed to the body, wherein an orthographic projection of the backlight on the body is not overlapped with orthographic projections of the limiting posts on the body;

an optical assembly on a side of the backlight away from the body, wherein the optical assembly is located in the accommodation space and fixed to the limiting posts; and a three-dimensional display assembly on a side of the optical assembly away from the body, wherein the three-dimensional display assembly covers the accommodation space and is fixed to the side walls.

2. The display apparatus according to claim 1, wherein the frame is made of a material comprising a heat conductive material.

3. The display apparatus according to claim 1, wherein the backlight is attached and secured to the body.

4. The display apparatus according to claim 1, wherein the three-dimensional display assembly comprises a protective cover plate, and a liquid crystal display screen and a liquid crystal lens screen which are positioned on a side of the protective cover plate facing the optical assembly, wherein the liquid crystal display screen and the liquid crystal lens screen are located in the accommodation space, and the protective cover plate is fixed to the side walls.

5. The display apparatus according to claim 4, further comprising a first chip on film, a second chip on film, a third chip on film, a first control circuit board, a second control circuit board, and a third control circuit board; wherein the first control circuit board, the second control circuit board, and the third control circuit board are fixed to a side of the body away from the accommodation space; and one edge of the body is provided with a hollowed-out structure, the first chip on film passes through the hollowed-out structure and is electrically connected between the liquid crystal lens screen and the first control circuit board, the second chip on film passes through the hollowed-out structure and is electrically connected between the liquid crystal display screen and the second control circuit board, and the third chip on film passes through the hollowed-out structure and is electrically connected between the backlight and the third control circuit board.

6. The display apparatus according to claim 5, wherein the second control circuit board and the third control circuit board are arranged side by side on the body, and the third control circuit board is located on a side of the second control circuit board away from the hollowed-out structure; and the first control circuit board is fixed to a side of the second control circuit board away from the body.

7. The display apparatus according to claim 5, further comprising a shield case on a side of the first control circuit board, the second control circuit board and the third control circuit board away from the body, and the shield case is fixed to the body, wherein an orthographic projection of the shield case on the body covers an orthographic projection of the first control circuit board on the body, an orthographic projection of the second control circuit board on the body, and an orthographic projection of the third control circuit board on the body.

8. The display apparatus according to claim 7, further comprising a camera integrated board in the accommodation space, wherein an orthographic projection of the camera integrated board on the body is located within an orthographic projection of the hollowed-out structure on the body, and the camera integrated board is fixed to one of the side walls adjacent to the hollowed-out structure.

9. The display apparatus according to claim 8, further comprising a fourth control circuit board fixed to a side of the shield case away from the body, and the fourth control circuit board is electrically connected to the camera integrated board.

10. The display apparatus according to claim 8, wherein the body is provided to protrude in a direction away from the accommodation space at a position where the camera integrated board is provided.

11. The display apparatus according to claim 8, further comprising a light-shielding member on a side of the camera integrated board away from the protective cover plate, and the light-shielding member is located between one of the side walls fixed with the camera integrated board and the optical assembly, wherein the light-shielding member is fixed between the integrated circuit board and the shield case.

12. The display apparatus according to claim 7, further comprising a system circuit board fixed to the side of the body away from the accommodation space, wherein the system circuit board and the shield case are arranged on the body in a staggered manner.

13. The display apparatus according to claim 12, further comprising a heat dissipation plate fixed to a side of the system circuit board away from the body.

14. The display apparatus according to claim 13, further comprising a housing on a side of the heat dissipation plate and the shield case away from the body, wherein the housing is fixed to a side edge of the body away from the accommodation space.

15. The display apparatus according to claim 14, further comprising a button assembly in a space enclosed by the housing and the body, and the button assembly is fixed to the housing.

16. The display apparatus according to claim 15, wherein the housing comprises button holes, the button assembly comprises an icon button board and a button control board, the icon button board comprises icon buttons arranged corresponding to the button holes, and the button control board is electrically connected to a side of the icon button board away from the housing, wherein the display apparatus further comprises an adapter connecting the icon button board and the housing, wherein an annular limiting rib is provided on the side of the body away from the accommodation space, and the annular limiting rib is located in the space enclosed by the housing and the body, and the annular limiting rib abuts against the housing, and wherein the adapter is fixed to the annular limiting rib.

17. The display apparatus according to claim 13, further comprising at least one turbofan fixed to a side of the heat dissipation plate facing the housing.

18. The display apparatus according to claim 13, further comprising at least one direct blowing fan fixed to a side of the body facing the housing, wherein the direct blowing fan, the system circuit board, and the shield case are arranged in a staggered manner.

19. The display apparatus according to claim 13, wherein the housing comprises at least one wall hanging hole, wherein an orthographic projection of the at least one wall hanging hole on the body is located within an orthographic projection of the system circuit board on the body, and the orthographic projection of the at least one wall hanging hole is staggered from an orthographic projection of the turbofan on the body, wherein the system circuit board and the heat dissipation plate comprise a through hole directly opposite to the wall hanging hole, and wherein the housing is recessed toward the accommodation space in a region surrounding the wall hanging hole.

20. The display apparatus according to claim 18, further comprising a wall hanging adapter fixed between the body and the housing adjacent to the wall hanging hole.

* * * * *